United States Patent [19]
Lee et al.

[11] Patent Number: 5,674,767
[45] Date of Patent: Oct. 7, 1997

[54] METHOD OF MANUFACTURING A SEMICONDUCTOR DEVICE HAVING A SELF-ALIGNED STRUCTURE FOR A SPLIT GATE FLASH MEMORY DEVICE

[75] Inventors: Sung Chul Lee; Jang Han Kim, both of Chungcheongbuk-do, Rep. of Korea

[73] Assignee: LG Semicon Co., Ltd., Chungcheongbuk-do, Rep. of Korea

[21] Appl. No.: 500,464

[22] Filed: Jul. 10, 1995

[30] Foreign Application Priority Data

Jul. 8, 1994 [KR] Rep. of Korea ............... 16479/1994

[51] Int. Cl.$^6$ .............................................. H01L 21/8247
[52] U.S. Cl. ...................... 437/43; 437/44; 148/DIG. 103
[58] Field of Search ............................... 437/43, 44, 49, 437/228 PL, 984; 148/DIG. 103

[56] References Cited

U.S. PATENT DOCUMENTS

| | | | |
|---|---|---|---|
| 4,833,514 | 5/1989 | Esquivel et al. | 437/43 |
| 5,028,553 | 7/1991 | Esquivel et al. | 437/43 |
| 5,070,032 | 12/1991 | Yuan et al. | 437/43 |
| 5,453,391 | 9/1995 | Yiu et al. | 437/43 |
| 5,510,284 | 4/1996 | Yamauchi | 437/43 |

OTHER PUBLICATIONS

Gheorghe Samachisa et al., "A 128K Flash EEPROM Using Double-Polysilicon Technology", IEEE Journal, vol. SC-22, No. 5, Oct. 1987, pp. 676–683.

Gautam Verma & Neal Mielke, "Reliability Performance of ETOX-Based Flash Memories", IEEE Catalog No. 88CH2508-0, Apr. 12–14, 1988, pp. 158–166.

*Primary Examiner*—Chandra Chaudhari
*Attorney, Agent, or Firm*—Finnegan, Henderson, Farabow, Garrett & Dunner, L.L.P.

[57] ABSTRACT

A method of manufacturing a nonvolatile memory device having a self-aligned structure includes the steps of forming a gate insulating film on a semiconductor substrate of a first conductivity type. A semiconductor layer is formed on the gate insulating film and etched to form floating gates and a semiconductor pattern between the floating gates. Impurity ions of a second conductivity type are implanted into the same side of the substrate as the floating gate is formed, to form a drain region. A planarizing film is deposited on the substrate and etched until the upper surfaces of the floating gates and the semiconductor pattern are exposed. The semiconductor pattern is removed and impurity ions of the second conductivity type are implanted into the substrate, to form a source region. The planarizing film is removed to expose the floating gate, and a dielectric film is formed thereon. Finally, a control gate is formed on the substrate.

9 Claims, 4 Drawing Sheets

METHOD OF MANUFACTURING A SEMICONDUCTOR DEVICE HAVING A SELF-ALIGNED STRUCTURE FOR A SPLIT GATE FLASH MEMORY DEVICE

I. BACKGROUND OF THE INVENTION

The present invention relates to a semiconductor device, and more particularly, to a method of manufacturing a nonvolatile memory device having a self-aligned structure.

An erasable programmable read-only memory (EPROM) tunnel oxide (ETOX™) structure shown in FIG. 1 and developed by Intel Corporation, USA, is a typical flash memory device, which is an electrically erasable programmable nonvolatile memory device.

Referring to FIG. 1, the flash memory device is comprised of a single transistor which includes a gate insulating film 1 formed on a silicon substrate 7 as a thin film tunnelling oxide film, a floating gate 2 and a control gate 4 formed on the gate insulating film 1, a capacitor dielectric film 3 formed between the floating gate 2 and the control gate 4, and source/drain impurity regions 5 and 6 formed on both sides of the gate in silicon substrate 7.

In the flash memory device of FIG. 1, a state where the floating gate 2 is filled with electrons is defined as a programming (writing) state, and a state where electrons escape from the floating gate 2 is defined as an erasing state.

During a programming operation, a voltage is applied to the control gate 4, electrons, injected from a channel region between the source/drain regions 5 and 6 into the floating gate 2 through the gate insulating film 1, accumulate in the floating gate 2. During an erasing operation, a positive voltage is applied to the source region 5 rather than to the control gate 4, so that the electrons accumulated in the floating gate 2 move to the source region 5 through the gate insulating film 1 and subsequently escape from the floating gate 2.

However, during the erasing operation of the information programmed in the flash memory device, overerasing is performed in order to completely remove electrons accumulated in the floating gate 2, and positive charges accumulate in the floating gate 2. As a result, an electron inversion layer is formed in the substrate underneath the floating gate 2 in the channel region between impurity regions 5 and 6. The electron inversion layer causes the source/drain regions 5 and 6 to become electrically conductive after the erasing operation is completed.

To solve the problem caused by overerasing, a flash memory device has been proposed having a split gate structure, which was developed by SEEQ, USA. The flash memory device having the split gate is comprised of one floating gate transistor connected in series with a simple enhanced MOS transistor which is controlled by the control gate. FIG. 2 is a cross-sectional view of a flash memory device having the conventional split gate structure.

The conventional flash memory device of FIG. 2 has a structure wherein the source/drain regions 11 and 12 are formed in the semiconductor substrate 10, a gate insulating film 13 is formed on the substrate 10, a floating gate 14 is formed on the gate insulating film 13 between the drain region 12 and a channel region C, and a control gate 16 is formed on the floating gate 14 extending to the gate insulating film 13 above the source region 12. The control gate 16 and the floating gate 14 are insulated from each other by a dielectric film 15.

In FIG. 2, reference numeral C represents the channel region of the memory device. Reference numeral C1 represents the channel region of the control gate 16. Reference numeral C2 represents the channel region of the floating gate 14.

In the conventional flash memory device of FIG. 2, the MOS transistor controlled by the control gate 16 is connected in series to the floating gate transistor which is charged during programming. Thus, the configuration solves the problem created by overerasing by allowing the electrons to escape from the floating gate. In other words, although the floating gate 14 is charged with positive charges and forms the electron inversion layer in the channel region C2 of the floating gate 14, the electron inversion layer is not formed in the channel region C1 of the control gate 16. Therefore, the source/drain regions 11 and 12 are not connected by the enhanced transistor connected in series to the floating gate transistor, so that the overerasing problem can be solved.

However, in the flash memory device having the conventional split gate structure, the channel length of the control gate 16 is determined during the process of forming the floating gate 14. Accordingly, in the case where a misalignment of a mask occurs during the photo-etching process forming the floating gate 14, a desired channel length of the control gate 16 cannot be readily obtained.

FIGS. 3a to 3e illustrate the manufacturing sequences of the flash memory device having a conventional split gate structure, which was developed by Sundisk Corporation.

Referring to FIG. 3a, an insulating film 27 consisting of an oxide film is formed on a p-type semiconductor substrate 20 and is photo-etched, thereby forming openings. Using the insulating film 27 as an ion-implantation blocking mask, n+-type impurity ions are implanted into a semiconductor substrate 20, thereby forming source/drain regions 21 and 22. The distance C between the source region 21 and the drain region 22 is the channel length of the memory device. Thus, the channel length of the memory device is determined by the formation of the source/drain regions 21 and 22.

As shown in FIG. 3b, after removing the insulating film 27, which serves as an ion-implantation blocking mask, a gate insulating film 23 is formed on/the substrate 20. Then, a polysilicon film 24' is formed on the gate insulating film 23.

As shown in FIG. 3c, after coating a photoresist film 28 on the polysilicon film 24', a photomask is aligned on the photoresist film 28, and the polysilicon film 24' is photo-etched. As shown in FIG. 3d, floating gates 24 are formed over the source/drain regions 21 and 22 and the channel region. As the floating gates 24 are formed, a channel length C2 of the floating gates 24 is determined, as well as a channel length C1 of the control gate which is formed in a subsequent process.

As shown in FIG. 3e, a dielectric film 25 is formed on the surfaces of the floating gates 24, and a control gate 26 is formed over the entire surface of the substrate, thereby obtaining the conventional split gate-type flash memory device.

In the flash memory device of FIGS. 3a–3e, the channel length of the control gate is predetermined by the formation of the floating gates, which causes a mask misalignment problem. As shown in FIG. 3c, the floating gate is formed on the basis of the n+ impurity regions, i.e., the source/drain regions 21 and 22, and misalignment between the n+ impurity regions and the floating gate is caused. During the photo-etching process forming the floating gates 24, in order to obtain the desired channel length C1 of the control gate 26, the photomask 29 must be precisely aligned to the desired position between the source/drain regions 21 and 22 and the channel region.

However, in the case where a photomask is misaligned, that is, where the photomask 29 of FIG. 3c moves to the left or the right, the channel length C2 of the right floating gate 24 is relatively increased or decreased. Therefore, the channel length C1 of the split control gates 26 is decreased or increased.

Accordingly, when manufacturing the highly integrated memory device of FIGS. 3a to 3e, if a sufficient channel length of the split control gate cannot be obtained due to misalignment, an electron inversion layer is formed in the channel region C2 underneath the split floating gate 24 during overerasing, which is in contact with a depletion region between the p-type silicon substrate 20 and the source region 21. If such a phenomenon is generated, the overerasing problem occurs, as discussed in regard to the flash memory device of FIG. 1.

II. SUMMARY OF THE INVENTION

It is an object of the present invention to provide a method for manufacturing a self-aligned flash memory device which avoids misalignments that occur in a split gate structure.

To accomplish the above object there is provided a method of manufacturing a flash memory device having a split gate structure, comprising the steps of forming a gate insulating film on a semiconductor substrate of a first conductivity type; forming a semiconductor layer on the gate insulating film; etching the semiconductor layer to simultaneously form floating gates, spaced apart by a uniform distance, and a semiconductor pattern between the floating gates; implanting ions of a second conductivity type into the substrate, on the same side as the floating gates are formed, to form a drain region; depositing a planarizing layer on the substrate and etching the planarizing layer until the upper surfaces of the floating gates and the semiconductor pattern are exposed; removing the semiconductor pattern; implanting ions of the second conductivity type into the substrate, where the semiconductor pattern was removed, to form a source region; removing the planarizing layer to expose the floating gates; forming a dielectric film on the surface of the exposed floating gate; and forming a control gate on the substrate.

Further, the present invention provides a method of manufacturing a flash memory device, comprising the steps of forming a field oxide film for isolating devices formed on a semiconductor substrate of a first conductivity type; forming a conductor layer on the semiconductor substrate and patterning the conductor layer to form a plurality of first gates and conductor patterns; implanting impurity ions of a second conductivity type into the substrate to form a first impurity region; forming an insulating film on the substrate; etching the insulating film so as to expose the upper surfaces of the first gates and the conductor patterns; removing the conductor patterns; implanting impurity ions of the second conductivity type into the substrate where the conductor patterns were removed to form a second impurity region; removing the remaining insulating film; forming a dielectric film on the first gates; and forming a second gate on the substrate and the dielectric film.

A p-type or n-type impurity may be used as the impurity of the first conductivity type, and a p-type or n-type impurity may be used as the impurity of the second conductivity type.

Further, the present invention includes a manufacturing method comprising the steps of forming a field region on a substrate; depositing a conductor layer on the substrate to thereby form a first gate; forming a first impurity region using the first gate as a mask; forming a dielectric film on the first gate; and forming a second gate on the dielectric film. This manufacturing method further comprises the steps of forming a conductor pattern when the first gate is formed by depositing a conductor layer; and removing the conductor pattern to thereby form a second impurity region.

Additional objects and advantages of the invention will be set forth in part in the description which follows, and in part will be obvious from the description, or may be learned by practice of the invention. The objects and advantages of the invention will be realized and attained by means of the methods and method steps particularly pointed out in the appended claims.

III. BRIEF DESCRIPTION OF THE DRAWINGS

IV. DESCRIPTION OF THE PREFERRED EMBODIMENT(S)

Reference will now be made in detail to the present preferred embodiment of the invention, an example of which is illustrated in the accompanying drawings. Wherever possible, the same reference numbers will be used throughout the drawings to refer to the same or like parts.

Figure 1:
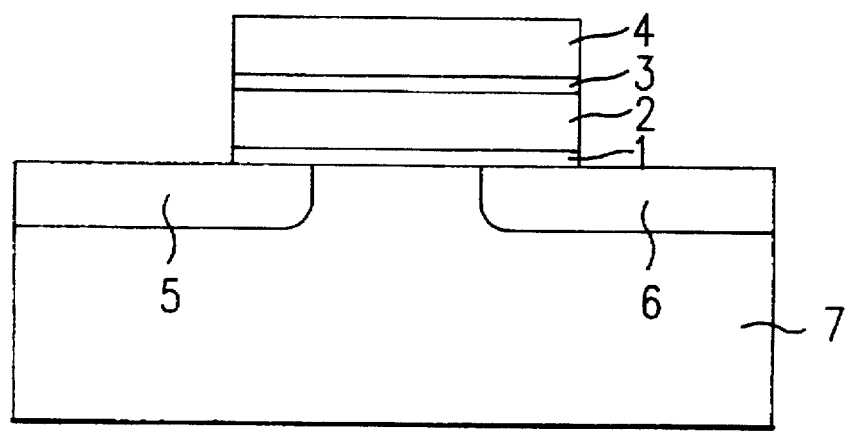
FIG. 1 is a cross-sectional view showing the structure of conventional flash memory device.
Figure 2:
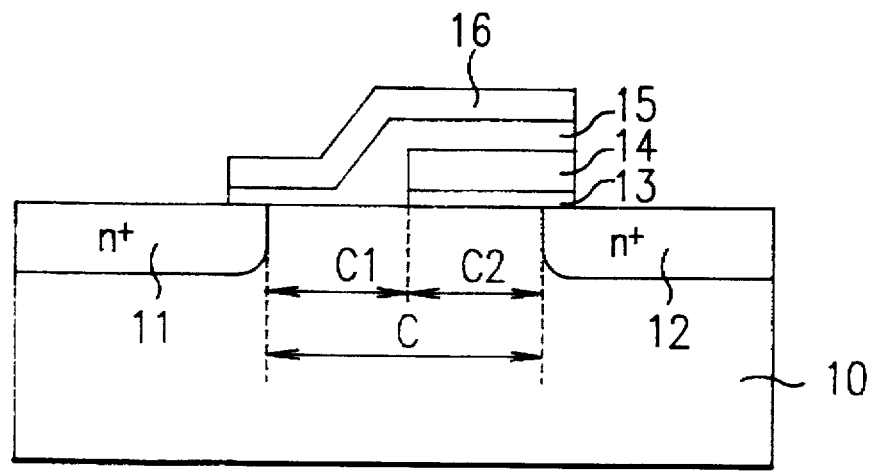
FIG. 2 is a cross-sectional view showing the structure of a flash memory device having a conventional split gate structure.
Figure 3A:
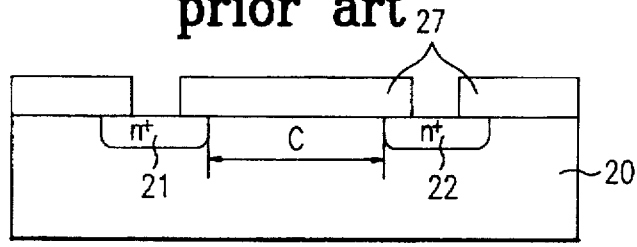
FIGS. 3a to 3e are cross-sectional views illustrating a method of manufacturing a flash memory device having a conventional split gate structure.
Figure 3B:
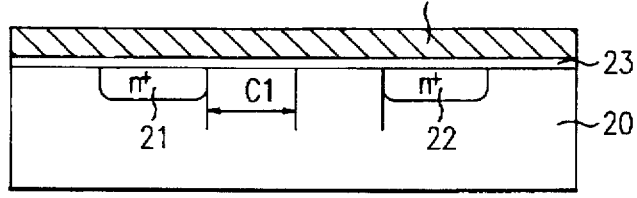
Figure 3C:
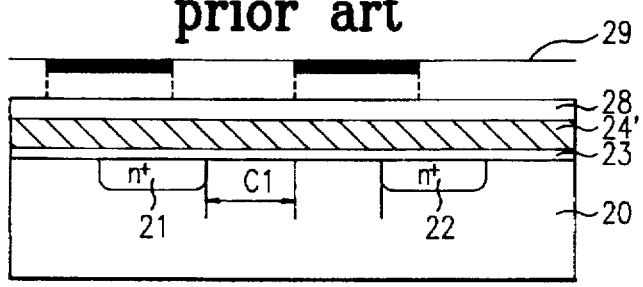
Figure 3D:
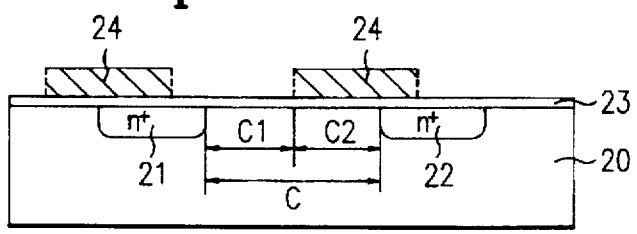
Figure 3E:
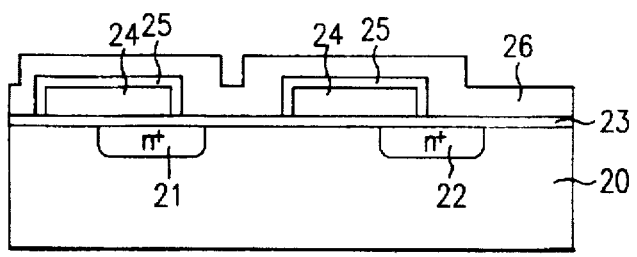
Figure 4A:
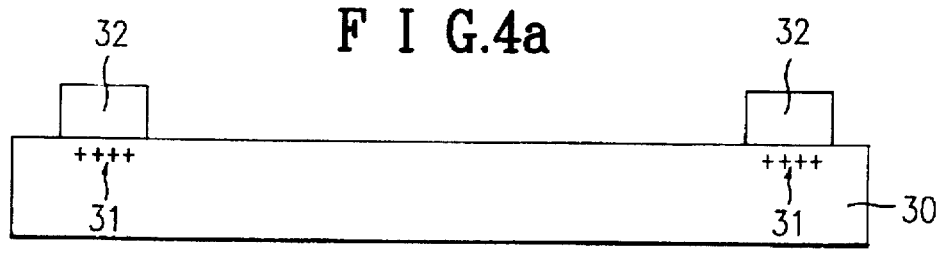
FIGS. 4a to 4i are cross-sectional views illustrating a method of manufacturing a flash memory device having a split gate structure according to a preferred embodiment of the present invention.

Referring to FIG. 4a, a device isolation process, such as a chemical vapor deposition method and a local oxidation of silicon (LOCOS) method, is performed on a p-type silicon substrate 30, forming a device isolating film 32. This isolates neighboring cells from one another.

In the silicon substrate 30 beneath the device isolating film 32, a p+-type channel stop region 31 of a high concentration is formed by ion-implantation. The ion-implantation process forming the channel stop region 31 may be performed before or after the forming of the device isolating film 32.

Figure 4B:
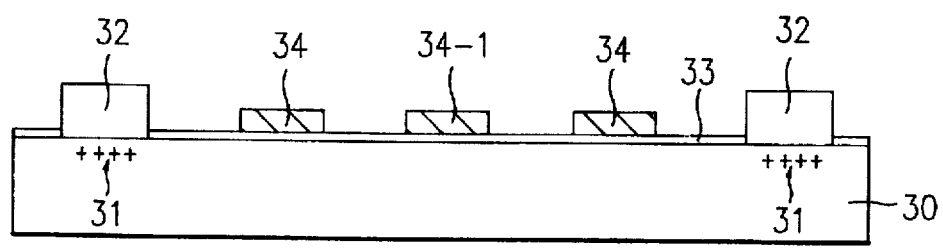

Referring to FIG. 4b, a thin gate insulating film 33 is formed on exposed portions of the surface of the silicon substrate 30, and a polysilicon film is deposited thereon. The polysilicon film is etched to simultaneously form floating gates 34 equally spaced apart from one another and a polysilicon film pattern 34-1 between the floating gates 34, where a source region will be formed. At this time, a channel length of a control gate, which is formed in a subsequent process, is determined by the distance between polysilicon pattern 34-1, which remains in the location where a source region will be formed, and the floating gates 34.

Figure 4C:
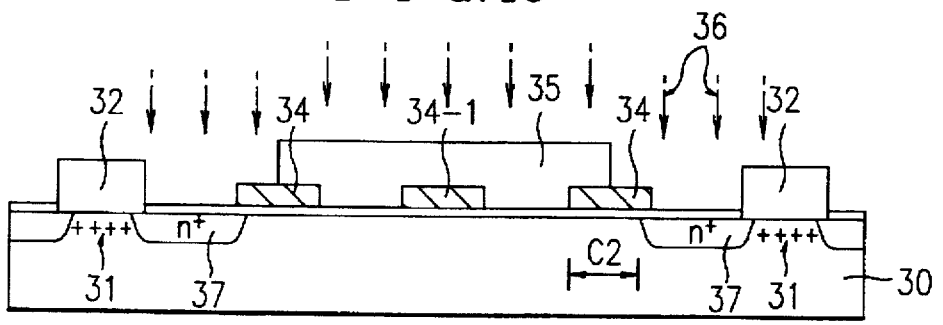

Referring to FIG. 4c, a photoresist film 35 is coated on the entire surface of the substrate and is then etched so as to remain between the floating gates 34 and the polysilicon pattern 34-1. Using the photoresist film 35 and the device isolating film 32 as masks, n+-type impurity ions 36, such as As ions, are implanted, to form a drain region 37. After forming the drain region 37, a channel length C2 of the floating gates 34 is determined.

Figure 4D:
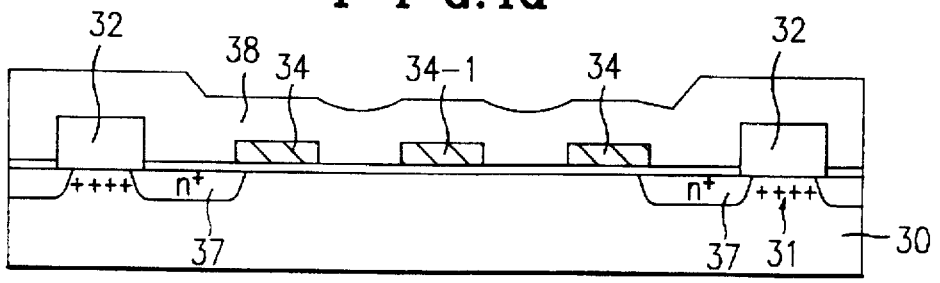
Figure 4E:
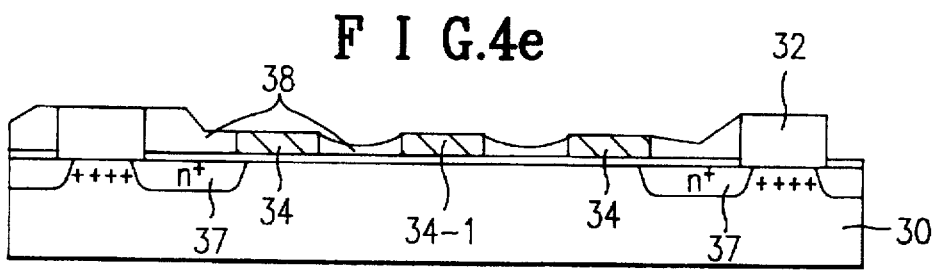

As shown in FIG. 4d, after removing the photoresist film 35, an oxide film 38 is deposited as a planarizing layer over the entire surface of the substrate. Then, as shown in FIG. 4e, the oxide film 38 is dry-etched so as to expose the upper surfaces of the floating gates 34 and the polysilicon pattern 34-1. At this time, the oxide film 38, which is left between the floating gates 34 and the polysilicon pattern 34-1, serves as an etch and ion-implantation mask in a subsequent process.

Figure 4F:
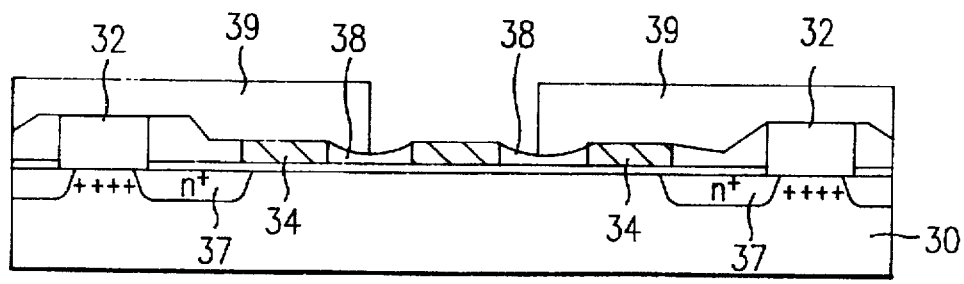

Referring to FIG. 4f, another photoresist film 39 is coated over the entire surface of the substrate and is patterned so as to expose the polysilicon pattern 34-1 between the floating gates 34.

Figure 4G:
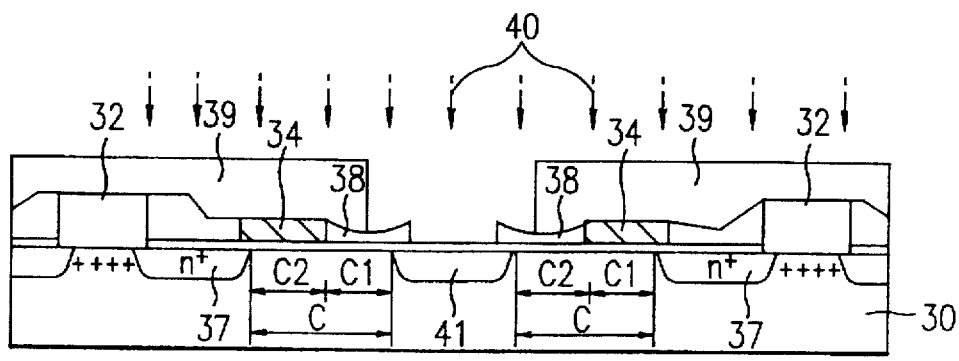

Referring to FIG. 4g, the exposed polysilicon pattern 34-1 is etched by using the oxide film 38 and the photoresist film 39 as masks. As a result, the substrate portion between floating gates 34 where a source region will be formed is exposed. N+-type impurity ions 40 are implanted in the exposed portion of the substrate where the polysilicon pattern 34-1 was removed, to form a source region 41. The oxide film 38 serves as an ion-implantation mask when the ion-implantation forming the source region is performed.

As described above, the channel length C of the memory device of the present invention is determined by the formation of the source region. The channel length of a control gate, which is formed in a subsequent process, is determined in a self-aligned fashion. The channel length of the control gate is determined as the difference between the channel length C of the memory device and the channel length C2 of the floating gate.

As shown in FIG. 4d, the drain region 37 is formed by the ion-implantation process after the floating gates 34 are formed, thereby determining the channel length C2 of the floating gates. As shown in FIGS. 4f and 4g, the source region 41 is formed in the self-aligned fashion by implanting ions into the portion of the substrate where the polysilicon pattern 34-1 was removed, thereby determining the channel length C of the memory device. Accordingly, after forming the floating gates 34, the source/drain regions are formed in the self-aligned fashion, so that the channel length is determined. Thus, the problem of photomask misalignment while forming the floating gates, as described in the conventional method, does not occur.

Figure 4H:
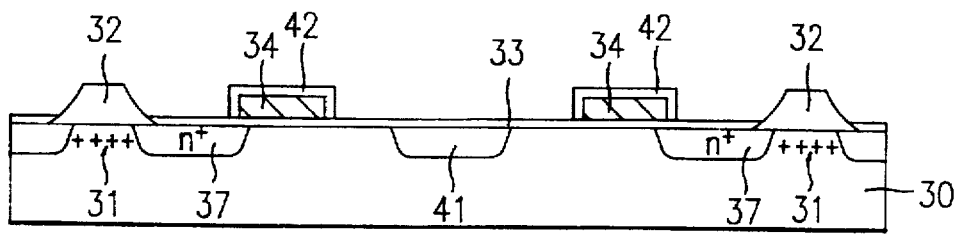
Figure 4I:
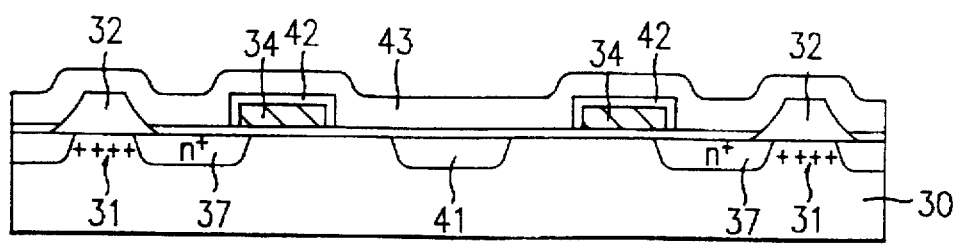

Referring to FIG. 4h, after removing the photoresist film 39, the oxide film 38 is removed by a wet or dry etching method, thereby exposing the floating gates 34. A dielectric film 42 is formed on the surface of the exposed floating gate 34, and a control gate 43 is formed as shown in FIG. 4i to obtain the flash memory device according to the embodiment of the present invention.

In the present invention, the provision of an isolating film 32 between cells, prevents one cell from being programmed when another cell is programmed. Due to such isolation, when one cell is programmed, spurious effects to another cell are completely prevented, so that the operation is more stable than the conventional memory device.

Furthermore, the problems due to misalignment, which occur in conventional flash memory devices having the split gate structure, are solved, and the channel length of the control gate can be precisely controlled.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

V. What is claimed is:

1. A method of manufacturing a semiconductor device, comprising the steps of:

forming a gate insulating film on a surface of a semiconductor substrate of a first conductivity type;

forming a semiconductor layer on said gate insulating film;

etching said semiconductor layer to simultaneously form floating gates equally spaced apart and a semiconductor pattern between said floating gates;

implanting impurity ions of a second conductivity type into said substrate to thereby form a drain region;

depositing a planarizing film on said substrate and etching said planarizing film until upper surfaces of said floating gates and said semiconductor pattern are exposed;

removing said semiconductor pattern;

implanting impurity ions of said second conductivity type into said substrate where said semiconductor pattern is removed, to thereby form a source region;

removing said planarizing film to thereby expose said floating gates;

forming a dielectric film on the surface of said exposed floating gates; and forming a control gate on said substrate.

2. A method of manufacturing a semiconductor device as claimed in claim 1, wherein said planarizing film serves as an etch mask when said semiconductor pattern is removed.

3. A method of manufacturing a semiconductor device as claimed in claim 1, wherein said planarizing film serves as an ion-implantation mask when the portion where the semiconductor pattern is exposed is ion-implanted.

4. A method of manufacturing a semiconductor device as claimed in claim 1, wherein a channel length is determined by a distance between said floating gates.

5. A method of manufacturing a semiconductor device as claimed in claim 1, wherein a channel length of said control gate is determined by a distance between said floating gates and said semiconductor pattern.

6. A method of manufacturing a semiconductor device, comprising the steps of:

forming a field oxide film for isolating devices on a semiconductor substrate of a first conductivity type;

forming a conductor layer on said semiconductor substrate and patterning said conductor layer to form a plurality of first gates and conductor patterns;

implanting impurity ions of a second conductivity type into said substrate, to thereby form a first impurity region;

forming an insulating film on said substrate;

etching said insulating film so as to expose upper surfaces of said first gates and said conductor patterns;

removing said conductor patterns;

implanting impurity ions of said second conductivity type into said substrate where said conductor pattern is removed, to thereby form a second impurity region;

removing said insulating film;

forming a dielectric film on said first gates; and forming a second gate on said substrate and said dielectric film.

7. A method of manufacturing a semiconductor device as claimed in claim 6, wherein said impurity of said first conductivity type is a p-type impurity and said impurity of said second conductivity type is an n-type impurity.

8. A method of manufacturing a semiconductor device as claimed in claim 6, wherein said impurity of said first conductivity type is an n-type impurity and said impurity of said second conductivity type is a p-type impurity.

9. A method of manufacturing a semiconductor device, comprising the steps of:

forming a gate insulating film on a surface of a substrate;

depositing a conductor layer on said gate insulating film to form a first gate;

forming a first impurity region in said substrate using said first gate as a mask;

encapsulating said first gate with a dielectric film;

forming a second gate on said dielectric film;

forming a conductor pattern on said gate insulating film concurrently with said first gate;

removing said conductor pattern subsequent to said first impurity region formation step; and forming a second impurity region in said substrate where said conductor pattern is removed.

* * * * *